US009614085B2

(12) United States Patent
Liao et al.

(10) Patent No.: US 9,614,085 B2
(45) Date of Patent: Apr. 4, 2017

(54) SEMICONDUCTOR STRUCTURE HAVING ENLARGED REGROWTH REGIONS AND MANUFACTURING METHOD OF THE SAME

(71) Applicant: TAIWAN SEMICONDUCTOR MANUFACTURING COMPANY LTD., Hsinchu (TW)

(72) Inventors: Chin-I Liao, Tainan (TW); Shih-Chieh Chang, Taipei (TW); Hsiu-Ting Chen, Tainan (TW); Shih-Hsien Cheng, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/250,014

(22) Filed: Aug. 29, 2016

(65) Prior Publication Data
US 2016/0365448 A1    Dec. 15, 2016

Related U.S. Application Data

(62) Division of application No. 14/674,474, filed on Mar. 31, 2015, now Pat. No. 9,450,047.

(51) Int. Cl.
| H01L 29/76 | (2006.01) |
| H01L 29/78 | (2006.01) |
| H01L 29/16 | (2006.01) |
| H01L 29/08 | (2006.01) |
| H01L 29/06 | (2006.01) |
| H01L 29/66 | (2006.01) |

(52) U.S. Cl.
CPC ...... *H01L 29/7848* (2013.01); *H01L 29/0653* (2013.01); *H01L 29/0847* (2013.01); *H01L 29/1608* (2013.01); *H01L 29/66636* (2013.01); *H01L 29/66795* (2013.01); *H01L 29/7851* (2013.01)

(58) Field of Classification Search
CPC .................................................. H01L 29/7833
USPC ......................................... 257/288; 438/294
See application file for complete search history.

(56) References Cited

U.S. PATENT DOCUMENTS

| 7,425,500 B2 * | 9/2008 | Metz ................. H01L 21/28518 257/E21.43 |
| 8,742,457 B2 * | 6/2014 | Yang ................... H01L 23/5252 257/183 |

(Continued)

*Primary Examiner* — Jami M Valentine
(74) *Attorney, Agent, or Firm* — WPAT, P.C., Intellectual Property Attorneys; Anthony King

(57) ABSTRACT

The present disclosure provides a semiconductor structure, including: an insulation region including a top surface; a semiconductor fin protruding from the top surface of the insulation region; a gate over the semiconductor fin; and a regrowth region partially positioned in the semiconductor fin, and the regrowth region forming a source/drain region of the semiconductor structure; wherein a profile of the regrowth region taken along a plane perpendicular to a direction of the semiconductor fin and top surfaces of the insulation region includes a girdle, an upper girdle facet facing away from the insulation region, and a lower girdle facet facing toward the insulation region, and an angle between the upper girdle facet and the girdle is greater than about 54.7 degrees.

20 Claims, 9 Drawing Sheets

(56) References Cited

U.S. PATENT DOCUMENTS

| | | | |
|---|---|---|---|
| 9,029,930 B2* | 5/2015 | Kelly | H01L 29/785 257/296 |
| 2011/0073952 A1* | 3/2011 | Kwok | H01L 29/045 257/368 |
| 2012/0199888 A1* | 8/2012 | Dai | H01L 29/045 257/288 |
| 2013/0049068 A1* | 2/2013 | Lin | H01L 29/7853 257/192 |
| 2014/0065782 A1 | 3/2014 | Lu et al. | |
| 2014/0252489 A1 | 9/2014 | Yu et al. | |

* cited by examiner

SEMICONDUCTOR STRUCTURE HAVING ENLARGED REGROWTH REGIONS AND MANUFACTURING METHOD OF THE SAME

CROSS-REFERENCE TO RELATED APPLICATIONS

This application is a divisional of U.S. application Ser. No. 14/674,474, filed Mar. 31, 2015, and claims priority thereto.

BACKGROUND

With the increasing down scaling of integrated circuits and increasingly higher requirements for integrated circuits, transistors need to have higher drive currents with increasingly smaller dimensions. Fin field-effect transistors (FinFETs) were thus developed.

As is known in the art, the drive currents of MOS transistors may benefit from the stresses in the channel regions of the MOS transistors. Therefore, the source and drain regions of the FinFET may be formed by removing portions of the respective fin not covered by the gate electrode, and regrowing epitaxy in the spaces left by the removed fin. The regrown epitaxy is used to form source and drain regions. The regrown source and drain regions may have the benefit of reducing the source/drain resistance. For instance, drive currents may be increased by reducing source/drain resistance. As such, there is a need for providing a FinFET semiconductor structure having a reduced source/drain resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
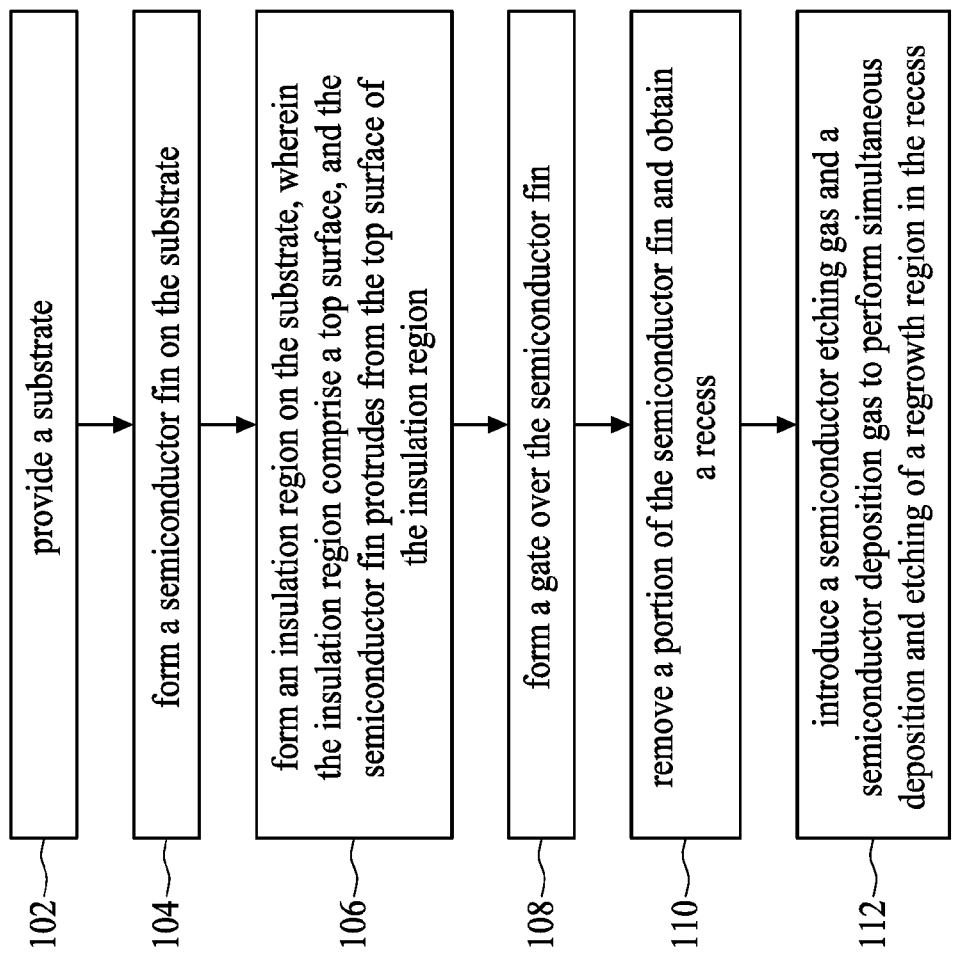
FIG. 1 is a flow chart illustrating a method for manufacturing a semiconductor structure according to one embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In order to reduce source and drain resistance of FinFET devices, small devices demand high source and drain dopant concentrations. However, high dopant concentrations, particularly in LDD regions, result in short channel effect (SCE). Other ways to reduce source and drain resistance include extending the LDD regions towards gates of FinFET devices, while the severe shadowing effect limits the LDD dopants from reaching the desired portion under the gate of FinFET devices. Due to the fin structure, the regrowth of the source/drain regions of a FinFET is not confined by shallow trench isolation regions, and hence the width of the regrown materials such as epitaxy is not limited. Since silicon epitaxy has a growth rate smaller on the (111) plane than on other planes, the regrown source/drain regions may not have a rectangular shape as that of the original fin. Instead, the regrown regions may extend laterally and form facets. The concept of the present application is to regrow a source/drain region with a larger volume. As a consequence of the enlarged volume, the source/drain resistance can be reduced, and device performance is therefore improved.

FIG. 1 is a flow chart illustrating a method for manufacturing a semiconductor structure according to one embodiment of the present application. The flow chart shows operation 102 of providing a substrate; operation 104 of forming a semiconductor fin on the substrate; operation 106 of forming an insulation region on the substrate, wherein the insulation region comprises a top surface, and the semiconductor fin protrudes from the top surfaces of the insulation region; operation 108 of forming a gate over the semiconductor fin; operation 110 of removing a portion of the semiconductor fin and obtaining a recess; and operation 112 of introducing a semiconductor etching gas and a semiconductor deposition gas to perform simultaneous deposition and etching of a regrowth region in the recess. Greater details are described as follows.

Figure 2:
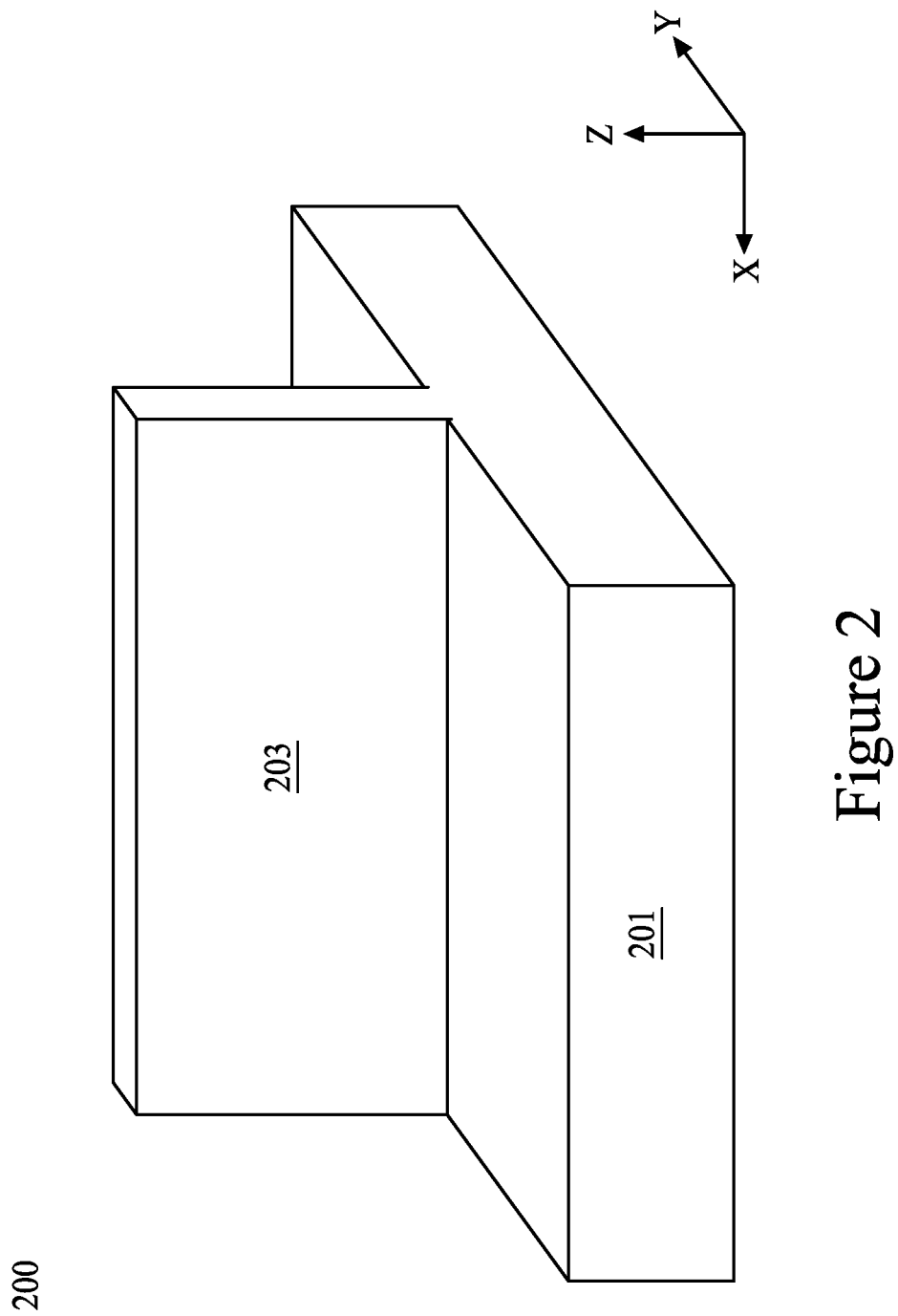
FIGS. 2-5 are perspective views of semiconductor devices according to some embodiments of the present disclosure.

FIG. 2 is a perspective view of a semiconductor device 200. In FIG. 2, a substrate 201 is provided 102. The substrate 201 may be a bulk silicon substrate. Alternatively, the substrate 201 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 201 also include a silicon-on-insulator (SOI) substrate. SOI substrates are fabricated using separation by implantation of oxygen (SIMOX), wafer bonding, and/or other suitable methods.

Some exemplary substrates 201 include an insulator layer. The insulator layer is comprised of any suitable material, including silicon oxide, sapphire, other suitable insulating materials, and/or combinations thereof. An exemplary insulator layer may be a buried oxide layer (BOX). The insulator is formed by any suitable operation, such as implantation (e.g., SIMOX), oxidation, deposition, and/or other suitable operation. In some exemplary FinFET, the insulator layer is a component (e.g., layer) of a silicon-on-insulator substrate.

The substrate 201 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 201, in a P-well structure, in an N-well structure, in a dual-well structure, or using a raised structure. The semiconductor substrate 201 may further include various active regions, such as regions configured for an N-type metal-oxide-semiconductor transistor device and regions configured for a P-type metal-oxide-semiconductor transistor device.

A semiconductor fin structure 203 is formed on the substrate 201, as an example to operation 104 of FIG. 1. The semiconductor fin 203 is arranged along the X direction. The fin structure 203 is formed by any suitable operation including various deposition, photolithography, and/or etching operations. An exemplary photolithography operation includes forming a photoresist layer (resist) overlying the substrate (e.g., on a silicon layer) 201, exposing the resist to a pattern, performing a post-exposure bake operation, and developing the resist to form a masking element including the resist. The masking element is then used to etch the fin structure 203 into the silicon layer. Area not protected by the masking element is etched using reactive ion etching (RIE) operations and/or other suitable operations. In an example, the semiconductor fin 203 is formed by patterning and etching a portion of the silicon substrate 201.

In another example, the fin structure 203 is formed by patterning and etching a silicon layer deposited overlying an insulator layer (for example, an upper silicon layer of a silicon-insulator-silicon stack of an SOI substrate). As an alternative to traditional photolithography, the fin structure 203 can be formed by a double-patterning lithography (DPL) operation. DPL is a method of constructing a pattern on a substrate by dividing the pattern into two interleaved patterns. DPL allows greater feature (e.g., fin) density. Various DPL methodologies include double exposure (e.g., using two mask sets), forming spacers adjacent features and removing the features to provide a pattern of spacers, resist freezing, and/or other suitable operations. It is understood that multiple parallel fin structures may be formed in a similar manner.

Suitable materials for forming the fin structure 203 include silicon and silicon germanium. In some embodiments, the fin structure 203 includes a capping layer disposed on the fins, such as a silicon capping layer. The fin structure 203 may also include various doped regions. For example, various doped regions can include lightly doped source/drain (LDD) regions and source/drain (S/D) regions (also referred to as heavily doped S/D regions). An implantation operation (i.e., a junction implant) is performed to form S/D regions. The implantation operation utilizes any suitable doping species. The doping species may depend on the type of device being fabricated, such as an NMOS or PMOS device. For example, the S/D regions are doped with p-type dopants, such as boron or $BF_2$; n-type dopants, such as phosphorus or arsenic; and/or combinations thereof. The S/D regions may include various doping profiles. One or more annealing operations may be performed to activate the S/D regions. The annealing operations include rapid thermal annealing (RTA) and/or laser annealing operations.

Figure 3:
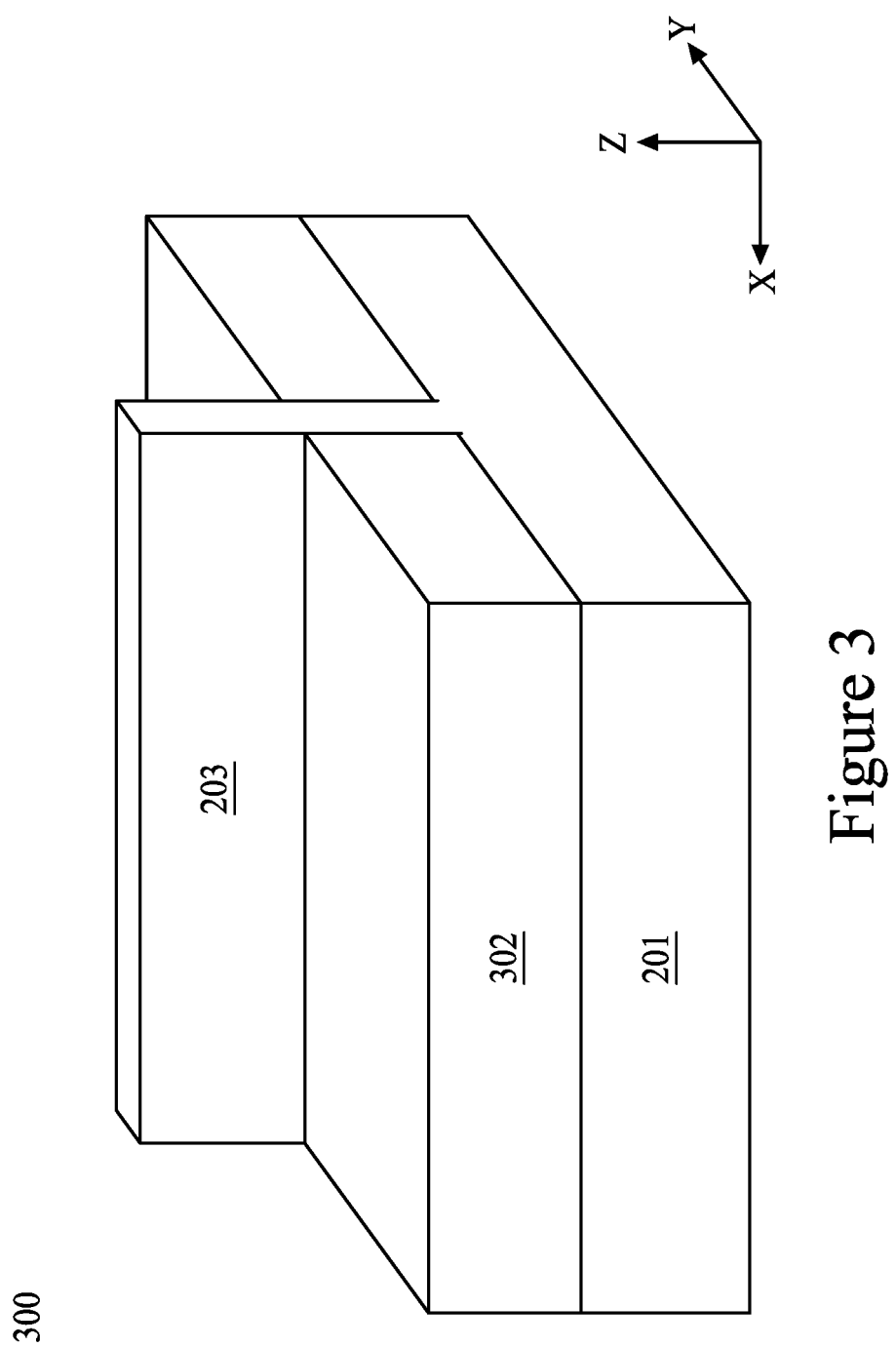

FIG. 3 is a perspective view of a semiconductor device 300. Exemplary isolation regions 302 are formed on the substrate 201 to isolate active regions of the substrate 201, as described in operation 106 of FIG. 1. The insulation region 302 comprises top surfaces, and the semiconductor fin 203 protrudes from the top surfaces of the insulation region 302 and partially adjacent to the insulation region 302. The isolation region 302 utilizes isolation technology, such as shallow trench isolation (STI), to define and electrically isolate the various regions. The isolation region 302 includes silicon oxide, silicon nitride, silicon oxynitride, an air gap, other suitable materials, or combinations thereof. The isolation region 302 is formed by any suitable operation. As one example, the formation of an STI 302 includes a photolithography operation, etching a trench in the substrate 201 (for example, by using a dry etching and/or wet etching), and filling the trench (for example, by using a chemical vapor deposition operation) with one or more dielectric materials. The trenches may be partially filled, as in the present embodiment, where the substrate 201 remaining between trenches forms the fin structure 203. In some examples, the filled trench may have a multi-layer structure such as a thermal oxide liner layer filled with silicon nitride or silicon oxide.

Figure 4:
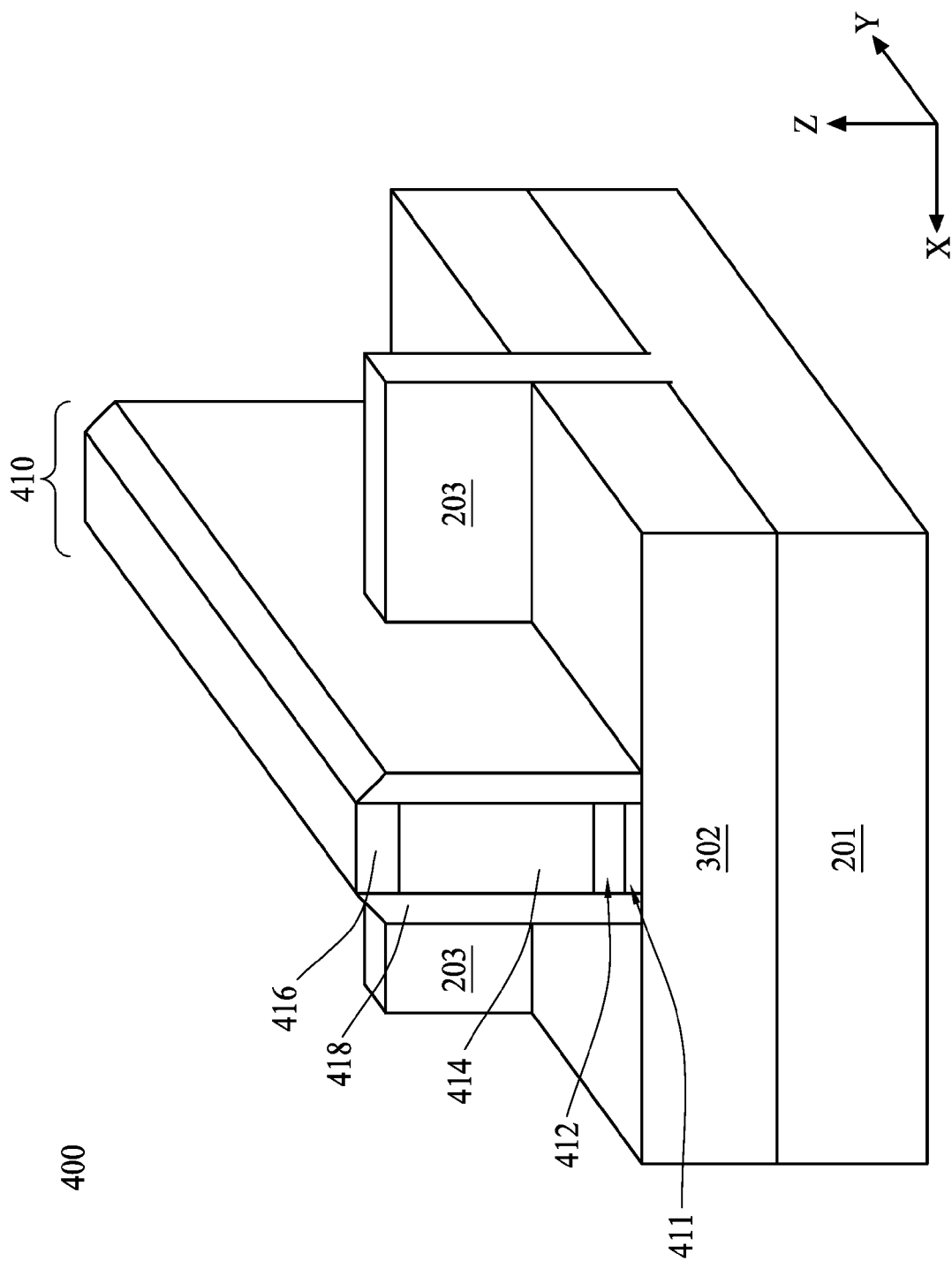

FIG. 4 is a perspective view of a semiconductor device 400. One or more gate structures 410 are formed over the substrate 201 in an orthogonal fashion (i.e. along the Y direction) and over a portion of the fin structure 203, as described in operation 108 of FIG. 1. The gate structure 410 may be comprised of a gate stack and may include a sealing layer and other suitable structures. The gate stack has an interfacial layer 411, a gate dielectric layer 412, a gate electrode layer 414, and a hard mask layer 416. It is understood that the gate stack may include additional layers such as capping layers, diffusion/barrier layers, dielectric layers, conductive layers, other suitable layers, and/or combinations thereof. The interfacial layer 411 of the gate structure 410 is formed over the substrate 201 and fin structure 203. The interfacial layer 411 is formed by any suitable operation to any suitable thickness. An exemplary interfacial layer 411 includes silicon oxide (e.g., thermal oxide or chemical oxide) and/or silicon oxynitride (SiON).

The gate dielectric layer 412 is formed over the interfacial layer 411 by any suitable operation. The gate dielectric layer 412 may be comprised of a dielectric material, such as silicon oxide, silicon nitride, silicon oxynitride, high-k dielectric material, other suitable dielectric material, and/or combinations thereof. Examples of high-k dielectric material includes $HfO_2$, HfSiO, HfSiON, HfTaO, HfTiO, lHfZrO, zirconium oxide, aluminum oxide, hafnium dioxide-alumina ($HfO2-Al_2O_3$) alloy, other suitable high-k dielectric materials, and/or combinations thereof.

The gate electrode layer 414 is formed over the gate dielectric layer 412 by any suitable operation. The gate electrode layer 414 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 416 is formed over the gate electrode layer 414 by any suitable operation. The hard mask layer 416 may be comprised of any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-operation (HARP) formed oxide, and/or other suitable material.

The gate stack of the gate structure 410 is formed by any suitable operation or operations. For example, the gate stack can be formed by a procedure including deposition, photolithography patterning, and etching operations. The deposition operations include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning operations include photoresist coating (e.g., spin-on coating), soft baking, mask aligning, exposure, post-exposure baking, developing the photoresist, rinsing, drying (e.g., hard baking), other suitable operations, and/or combinations thereof. Alternatively, the photolithography exposing operation is implemented or replaced by other proper methods such as maskless photolithography, electron-beam writing, and ion-beam writing. The etching operations include dry etching, wet etching, and/or other etching methods (e.g., reactive ion etching).

The gate structure 410 may further include a gate spacer 418. The gate spacers 418, which are positioned on each side of the gate stack (on the sidewalls of the gate stack), may be comprised of a dielectric material, such as silicon nitride, silicon carbide, silicon oxynitride, other suitable materials, and/or combinations thereof. In some embodiments, the gate spacers 418 are used to offset subsequently formed doped regions, such as source/drain regions. The gate spacers 418 may further be used for designing or modifying the source/drain region (junction) profile.

Figure 5:
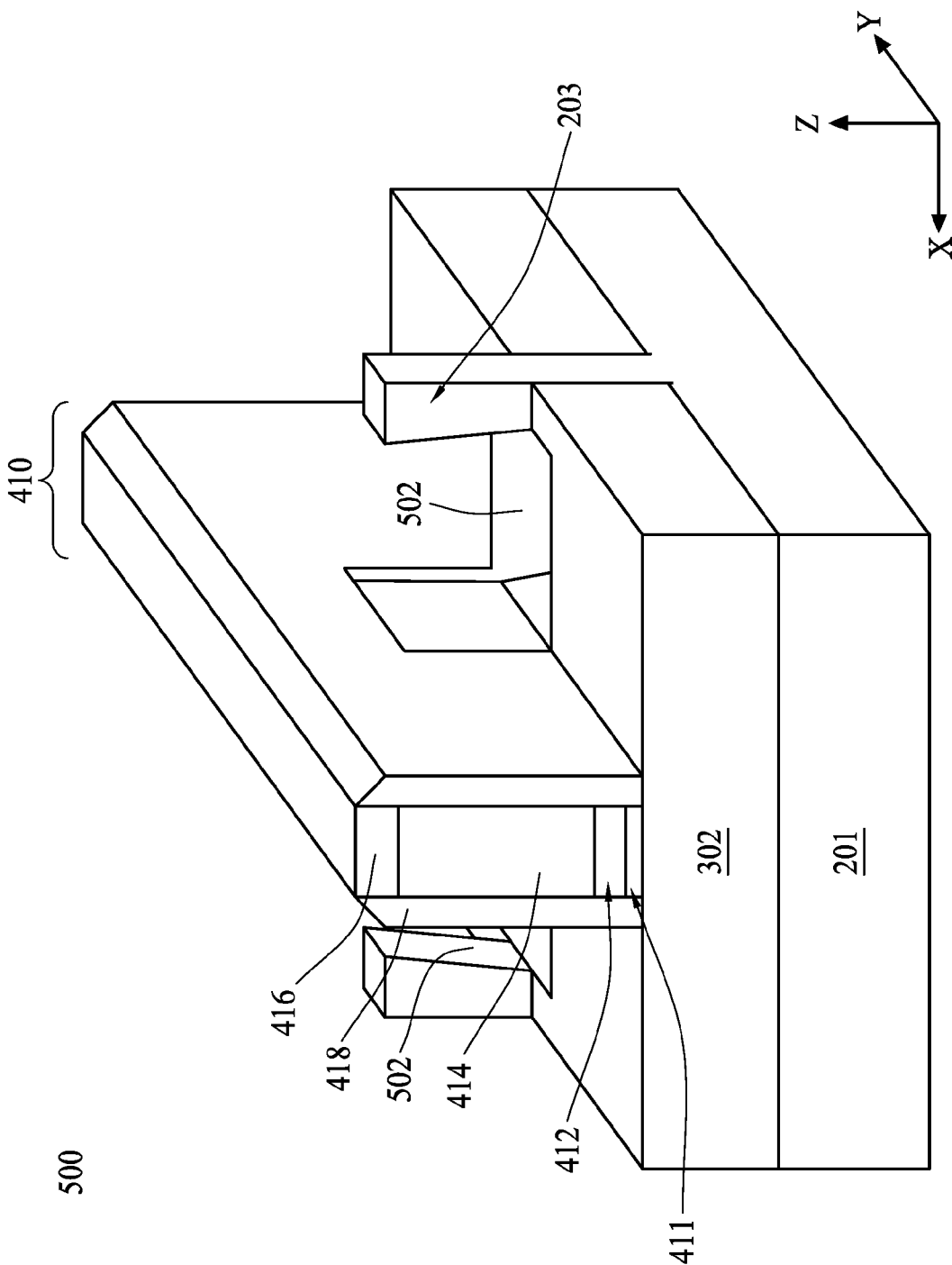

FIG. 5 is a perspective view of a semiconductor device 500. The semiconductor device 500 possesses recesses 502. Any suitable amount of material may be removed from the semiconductor fin 203 to form the recesses 502, as described in operation 110 of FIG. 1. However, the amount of the recesses 502 removed can be tailored by controlling etching conditions, that is, the depth of the recesses 502 is controllable by applying different etchant at various etching conditions. In the depicted embodiment shown in FIG. 5, the recesses 502 are obtained by removing a predetermined portion of the semiconductor fin 203. With respect to an aspect of the X direction, the recesses 502 may extend from the gate spacers 418 of the metal gates 410 towards a direction away from the metal gates 410 at a predetermined length. The length may be determined based on the dimensions of the source/drain regions in normal cases according to practical design considerations and the manufacturing operation adopted, and is not a limitation of the disclosure. With respect to an aspect of the Y direction, the recesses 502 may include merely the semiconductor fin 203; or alternatively, the recesses 502 may further extend to include a portion of the isolation regions 302. With respect to an aspect of the Z direction, the recesses 502 may extend to the substrate 201.

The removing operation 110 of FIG. 1 may include forming a photoresist layer or a capping layer (such as an oxide capping layer) over the semiconductor structure 400, patterning the photoresist or capping layer to have openings that expose the S/D regions of the semiconductor structure 400, and etching back material from the semiconductor fin 203 and down to the substrate 201. The semiconductor structure 400 is etched by an anisotropic etching operation followed by an isotropic etching operation. In some embodiments, the etching operation may employ another etching operation, and this is not a limitation of the disclosure. For example, the removal may include a lithography operation to facilitate the etching operation. The lithography operation may include photoresist coating (e.g., spin-on coating), soft baking, mask aligning, exposure, post-exposure baking, developing the photoresist, rinsing, drying (e.g., hard baking), other suitable operations, or combinations thereof. Alternatively, the lithography operation may be implemented or replaced by other methods, such as maskless photolithography, electron-beam writing, and ion-beam writing. In yet another alternative, the lithography operation could implement nanoimprint technology.

Figure 6:
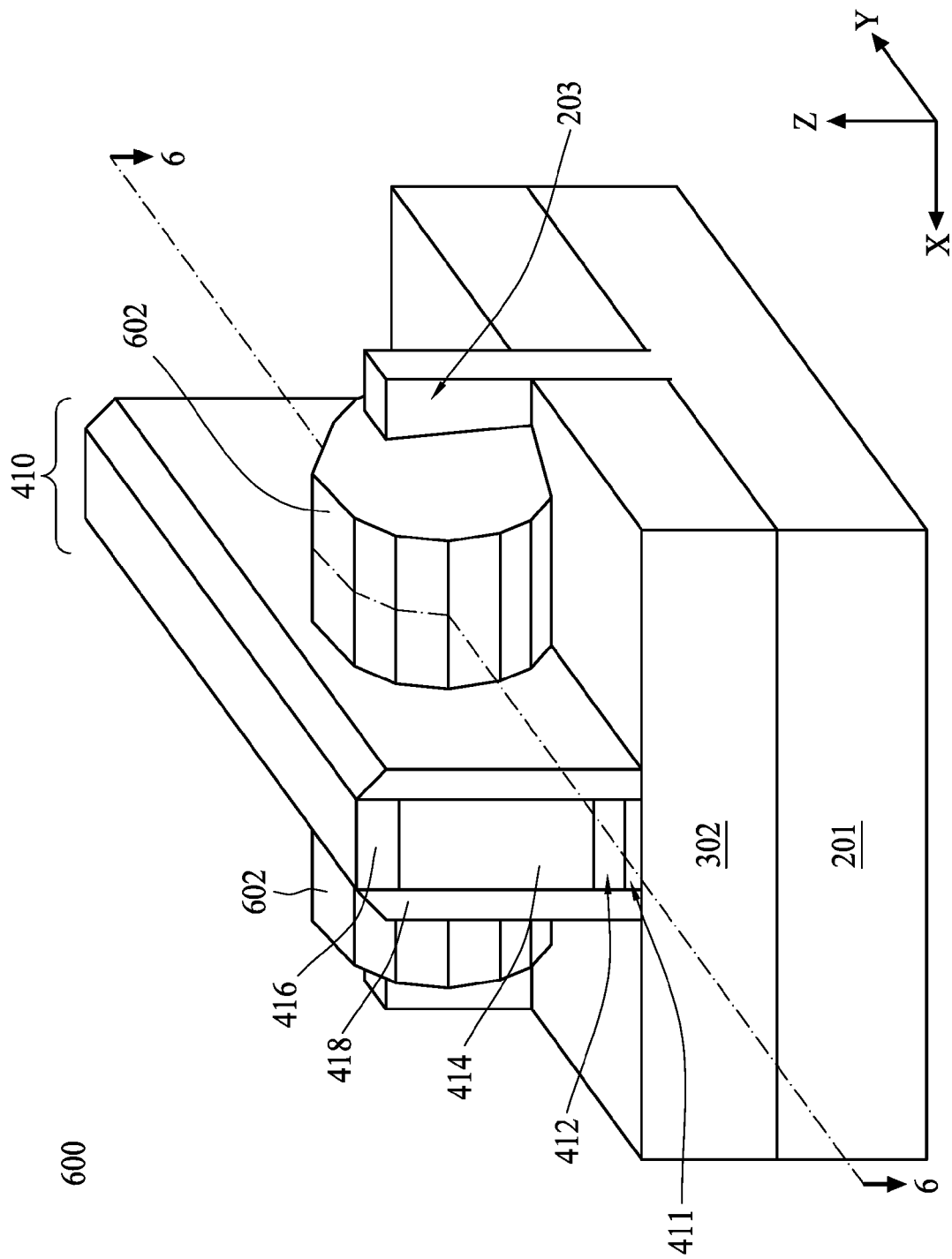
FIG. 6 is a perspective view of an NMOS FinFET according to an embodiment of the present disclosure.

FIG. 6 is a perspective view of an NMOS FinFET 600 according to an embodiment of the disclosure. The FinFET 600 is produced by generating regrowth regions 602 at the recess 502 of the semiconductor structure 500. The regrowth regions 602 as a whole are formed as S/D regions of the FinFET 600. In this embodiment, a semiconductor etching gas and a semiconductor deposition gas are simultaneously introduced to perform selective deposition and selective etching of the regrowth regions 602 in the recesses 502. During the deposition and etching operation, one or more carrier gases (such as $N_2$ or He) may flow. In some embodiments, the flow rate of the carrier gas may remain constant throughout the deposition and etch operation. In other embodiments, the flow rate of the carrier gas may fluctuate, such that the flow rate may be ramped up and/or down. In one embodiment, the carrier gas will be $H_2$ and will flow continuously during the deposition and etching operation.

In this embodiment, an etchant will be introduced at the same time as the introduction of a deposition precursor. Specifically, a silicon-containing source vapor is introduced to at least partially selectively deposit silicon-containing material in the substrate recesses 502 while maintaining continuous etchant flow. In some embodiments, the selectivity will be perfect such that net deposition occurs only in a desired region, such as in a semiconductor recesses 502 with no net deposition in other regions, such as on field isolation regions 302. In other embodiments, the selective deposition may be deposit materials in areas besides the recesses 502, such as on insulators 302 adjacent to the semiconductor recesses 502. For example, a silicon-containing source vapor may result in the deposition of non-epitaxial (polycrystalline or amorphous) material on exposed insulator regions 302. Such partial selectivity during the deposition phase is acceptable in the present application as the continuous flow of etchants helps to control the growth of such non-epitaxial material to be thinner over insulators 302 or other non-crystal material.

The continuous flow of one or more vapor-phase etchants may include one or more etchants that flow throughout the selective deposition and etching operation. In some embodiments, one or more etchants may be introduced intermittently throughout the operation, while at least one other etchant is flowing at all times throughout the selective deposition operation. For example, according to one embodiment, a continuous etchant flow may include introducing $Cl_2$ as an etchant throughout the selective deposition operation, while introducing HCl and/or germane as a second etching agent periodically during the $Cl_2$ flow. Providing an etchant during a deposition operation can provide a number of benefits. For example, growth rates during the deposition can be tuned for various purposes (step coverage, dopant incorporation, throughput speed, etc.) independently of the need for selectivity.

In one embodiment, a single vapor-phase etchant is introduced, while in other embodiments, two, three, or more vapor-phase etchants may be used throughout the selective deposition operation. These etchants may include halide gases, such as $Cl_2$ and HCl. Other examples include $Br_2$, HBr, and HI. One or more of these etchants will be introduced into a processing chamber having a temperature between a predetermined range, and a pressure in another predetermined range. In some embodiments, the temperature and/or pressure may fluctuate during the selective deposition operation. For example, in one embodiment, pressure may vary during the selective deposition operation. In other embodiments, it is typically more efficient to select conditions under which temperature or the pressure will remain constant during the operation. In a preferred embodiment, both the temperature and the pressure will remain constant such that the selective deposition and selective etch operation can take place under isothermal and isobaric conditions, which helps to ensure a high throughput.

The silicon-containing source vapor may comprise, but is not limited to, one or more of the following sources, including silane (SiH4), dichlorosilane or DCS ($SiCl_2H_2$), disilane ($Si_2H_6$), monochlorodisilane (MCDS), dichlorodisilane (DCDS), trisilane ($Si_3H_8$), or 2,2-dichlorotrisilane. The silicon-containing source vapor may be introduced into a processing chamber during the continuous etchant flow by itself, forming epitaxial silicon-containing materials on the recesses 502. In some embodiments, the Si-containing source vapor will be introduced along with a germanium source, a carbon source, an electrical donor or acceptor dopant source, a tin source or combinations thereof. In some embodiments in which a silicon-containing source vapor is introduced with a germanium source, a layer of silicon germanium may be deposited on the substrate recesses 502. For some embodiments that include a carbon source, such as monomethyl silane (MMS), a silicon-containing regrowth having carbon will be deposited, such as carbon-doped silicon or carbon-doped silicon germanium. For embodiments that include a dopant source, such as phosphine ($PH_3$) or arsine (AsH3), a layer incorporating a dopant will be deposited on the substrate recesses 502, such as phosphorous-doped silicon carbon or arsenic-doped silicon carbon for NMOS devices. As is known in the art, tensile strain exerted by Si:C can improve NMOS transistor performance.

Figure 7:
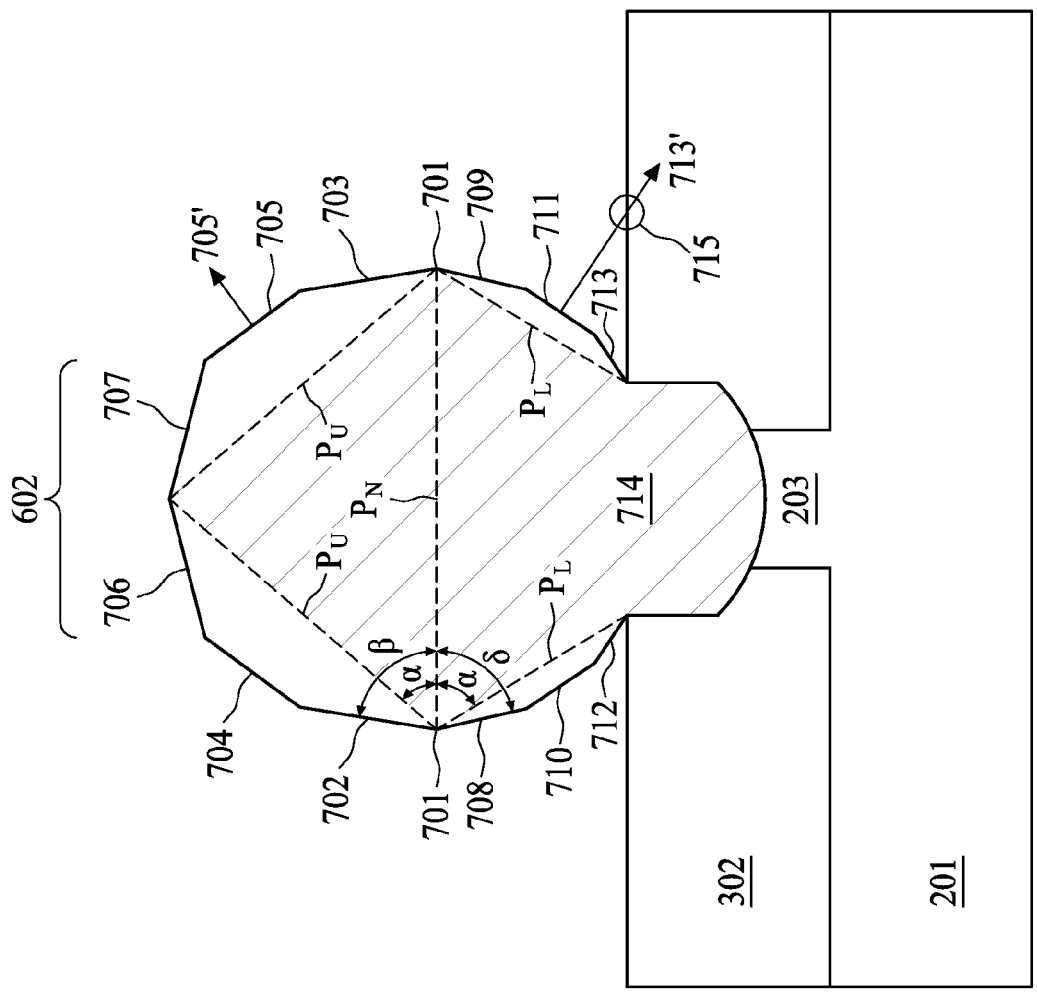
FIG. 7 is a cross-sectional view of an NMOS FinFET taken along line 6-6 of FIG. 6 according to an embodiment of the present disclosure.

In this embodiment, a gas flow ratio of the semiconductor etching gas to the semiconductor deposition gas is less than about 0.1. For instance, a ratio of the vapor-phase etchants to the silicon-containing source vapor may be 0.08. In one embodiment, a ratio of HCl to DCS is less than about 0.1. In some embodiments, the ratio may fluctuate between 0 and 0.1 during the selective deposition and etching operation, so as to obtain a desired profile of the regrowth region 602. Please refer to FIG. 6 in conjunction with FIG. 7. Solid lines of FIG. 7 form a cross-sectional view of the NMOS FinFET 600 taken along the lines 6-6 of FIG. 6 according to an embodiment of the disclosure. The cross-sectional profile of the regrowth region 602 shown in FIG. 7 possesses a girdle 701. The girdle 701 is located at vertexes forming a widest width of the regrowth region 602, and separates the upper girdle facets 702-707 and the lower girdle facets 708-713. The upper girdle facets 702-707 are facets above a plane $P_N$ across the girdle 701; and the lower girdle facets 708-713 are facets below the plane $P_N$. As shown in FIG. 7, the outward-pointing normal 705' of the upper girdle facet 705 extends away from the surface where the regrowth region 602 resides, whereas the outward-pointing normal 713' of the lower girdle facet 713 extends toward the aforesaid surface and intersects therewith at point 715. Alternatively stated, upper girdle facets 702-707 facing away from the insulation region 302, and lower girdle facets 708-713 facing toward the insulation region 302. In this embodiment, the upper girdle facets 702, 704 and 706 are substantially symmetrical to the upper girdle facets 703, 705 and 707; and the lower girdle facets 708, 710 and 712 are substantially symmetrical to the lower girdle facets 709, 711 and 713. The plane $P_N$ is substantially parallel to the top surface of the insulation region 302. The upper girdle facet 702 and the plane $P_N$ form an angle β. The lower girdle facet 708 and the plane $P_N$ form an angle δ.

Dotted lines of FIG. 7 show an imaginary construct of a cross section of a regrowth region prepared by cyclic deposition etch (CDE), superpositioned over a real construct of the cross section of the regrowth region 602 along line 6-6 of FIG. 6. Normally, with an epitaxy operation including CDE, silicon epitaxy has a growth rate smaller on planes $P_U$ and $P_L$, which have the {111} surface orientations, than on other planes. The planes $P_U$ and $P_N$ form an angle α of about 54.7 degrees; and the planes $P_L$ and $P_N$ also form the angle α of substantially 54.7 degrees. In this embodiment, the angle β of the upper girdle facet 702 is greater than the angle α, and the angle δ of the lower girdle facet 708 is also greater than the angle α. In some embodiments, the upper girdle facet 702 may be an {mn1} plane, and m and n are integers greater than 1; and the lower girdle facet may be an {pq1} plane, and p and q are integers greater than 1. As such, an area of the cross-sectional profile of the regrowth region 602 shown in FIG. 7 is greater than an area of a reference profile 714 confined by the planes $P_L$ and $P_U$. In other words, a volume of the regrowth region 602 is greater than a volume of a reference regrowth region possessing the reference cross-sectional profile 714. Moreover, to facilitate the area of the cross-sectional profile comparison previously discussed, a girdle width of the regrowth regions 602 is set to be substantially the same as a width of the reference regrowth regions. As mentioned above, the regrowth region 602 may be comprised of an epitaxy material. In some embodiments, the regrowth region 602 may include n-type dopants, thereby forming an n-type epitaxy. In some embodiments, the regrowth region 602 may include p-type dopants, thereby forming a p-type epitaxy.

Figure 8:
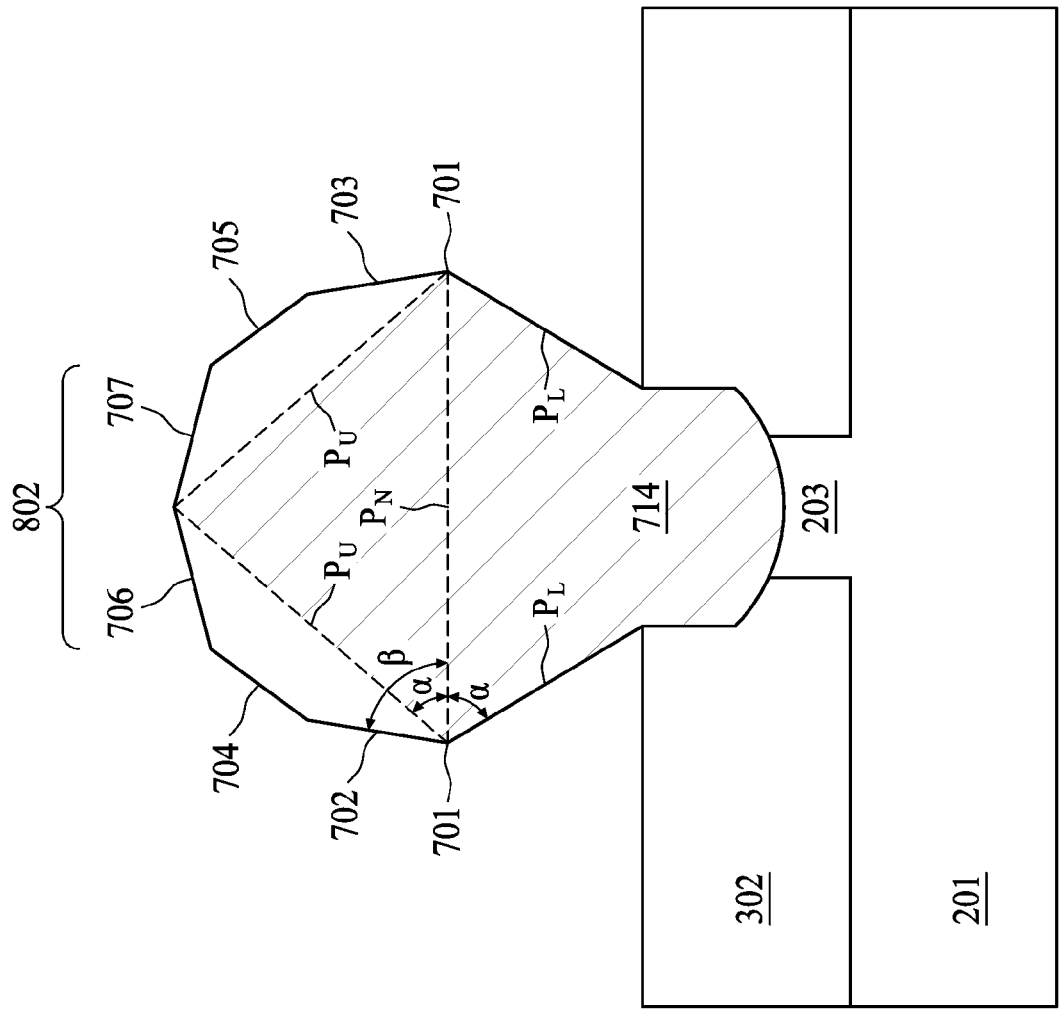
FIG. 8 is a cross-sectional view of an NMOS FinFET according to another embodiment of the present disclosure.
Figure 9:
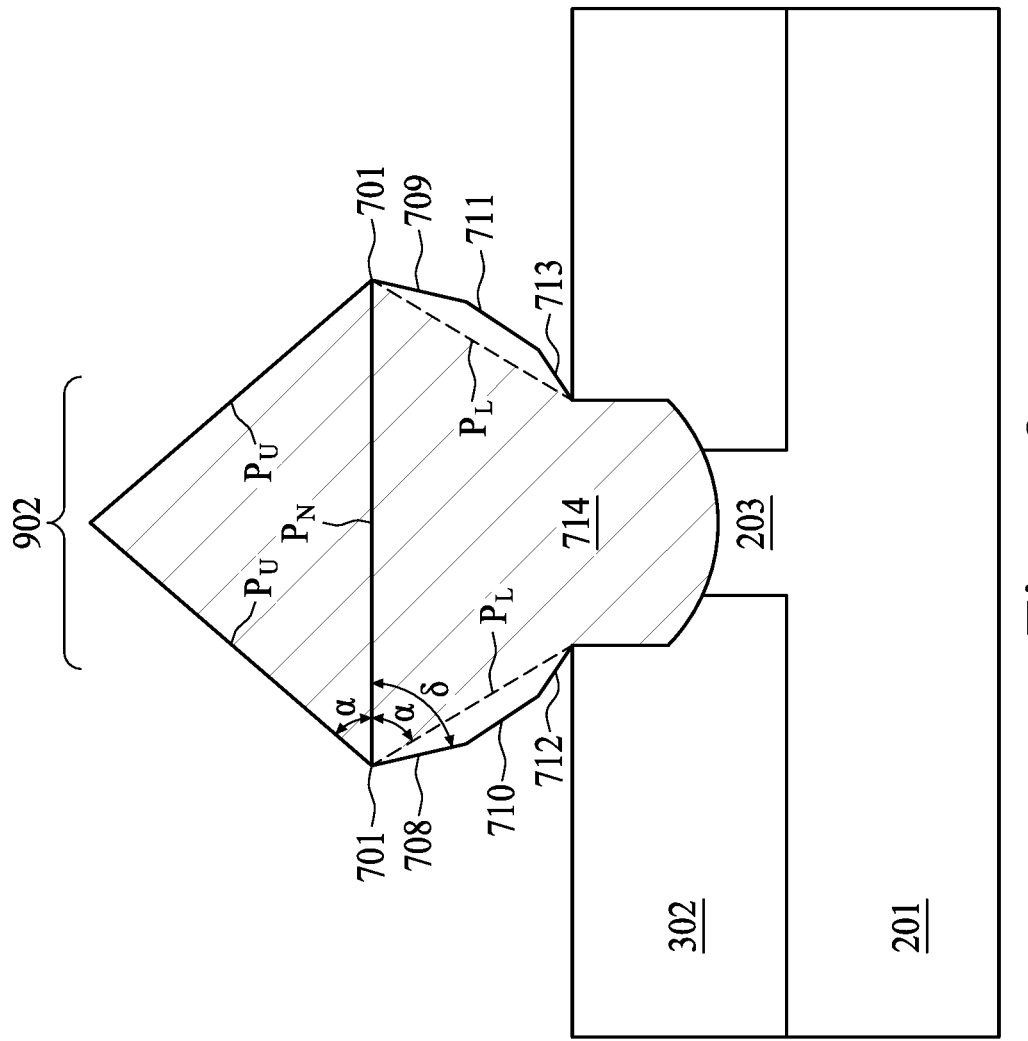
FIG. 9 is a cross-sectional view of an NMOS FinFET according to still another embodiment of the present disclosure.

In this embodiment, the angle β is in between a range of about 54.7 degrees and 90 degrees, and the angle δ is in between a range of about 54.7 degrees and 90 degrees. In some embodiments, the profile of the regrowth region 602 may include more or less number of upper and/or lower girdle facets. The number of facets is not a limitation of the disclosure as long as the volume confined by the upper girdle and lower girdle facets is greater than the volume of the reference regrowth region confined by the planes $P_L$ and $P_U$. FIG. 8 is a cross-sectional view of an NMOS FinFET according to another embodiment of the disclosure. A cross-sectional profile 802 shown in FIG. 8 possesses the upper girdle facets 702-707 and lower girdle facets grown along the (111) surface $P_L$. An area of the cross-sectional profile 802 shown in FIG. 8 is greater than an area of the reference profile 714 confined by the planes $P_L$ and $P_U$. FIG. 9 is a cross-sectional view of an NMOS FinFET according to still another embodiment of the disclosure. A cross-sectional profile 902 shown in FIG. 9 possesses the lower girdle facets 708-713 and upper girdle facets grown along the (111) surface $P_U$. An area of the cross-sectional profile 902 shown in FIG. 9 is greater than an area of the reference profile 714 confined by the planes $P_L$ and $P_U$.

The aforementioned embodiments disclose FinFET devices with regrown source/drain regions having larger volumes. As a consequence of the enlarged volume, the source/drain resistance can be reduced, and device performance is therefore improved.

Some embodiments of the present disclosure provide a semiconductor structure, including: an insulation region including a top surface; a semiconductor fin protruding from the top surface of the insulation region; a gate over the semiconductor fin; and a regrowth region partially positioned in the semiconductor fin, and the regrowth region forming a source/drain region of the semiconductor structure; wherein a profile of the regrowth region taken along a plane perpendicular to a direction of the semiconductor fin and top surfaces of the insulation region includes a girdle, an upper girdle facet facing away from the insulation region, and a lower girdle facet facing toward the insulation region, and an angle between the upper girdle facet and the girdle is greater than about 54.7 degrees.

In some embodiments of the present disclosure, the angle is greater than about 54.7 degrees and less than about 90 degrees.

In some embodiments of the present disclosure, an angle of the lower girdle facet is greater than about 54.7 degrees.

In some embodiments of the present disclosure, the angle of the lower girdle facet is less than about 90 degrees.

In some embodiments of the present disclosure, the upper girdle facet is an {mn1} plane, and m and n are integers greater than 1.

In some embodiments of the present disclosure, the lower girdle facet is an {pq1} plane, and p and q are integers greater than 1.

In some embodiments of the present disclosure, the regrowth region includes an epitaxy material.

In some embodiments of the present disclosure, the regrowth region includes n-type dopants.

In some embodiments of the present disclosure, the regrowth region includes p-type dopants.

Some embodiments of the present disclosure provide a semiconductor structure, including: an insulation region including a top surface; a semiconductor fin protruding from the top surface of the insulation region; a gate over the semiconductor fin; and a regrowth region partially positioned in the semiconductor fin, and the regrowth region forming a source/drain region of the semiconductor structure; wherein a profile of the regrowth region taken along a plane perpendicular to a direction of the semiconductor fin and top surfaces of the insulation region includes a girdle possessing a width, a plurality of upper girdle facets facing away from the insulation region, and a plurality of lower girdle facets facing toward the insulation region, and an area of the profile of the regrowth region is greater than an area of a reference profile including a girdle possessing the width, an upper girdle facet possessing an angle of about 54.7 degrees, and a lower girdle facet possessing an angle of about 54.7 degrees.

In some embodiments of the present disclosure, at least one of the plurality of upper girdle facets possesses an angle greater than about 54.7 degrees.

In some embodiments of the present disclosure, at least one of the plurality of lower girdle facets possesses an angle greater than about 54.7 degrees.

In some embodiments of the present disclosure, at least one of the plurality of upper girdle facets possesses an {mn1} plane, and m and n are integers greater than 1.

In some embodiments of the present disclosure, at least one of the plurality of upper girdle facets possesses a {pq1} plane, and p and q are integers greater than 1.

In some embodiments of the present disclosure, the regrowth region includes an epitaxy material.

In some embodiments of the present disclosure, the regrowth region includes n-type dopants.

In some embodiments of the present disclosure, the regrowth region includes p-type dopants.

Some embodiments of the present disclosure provide a method for manufacturing a semiconductor structure, including: providing a substrate; forming a semiconductor fin on the substrate; forming an insulation region on the substrate, wherein the insulation region includes a top surface, and the semiconductor fin protrudes from the top surface of the insulation region; forming a gate over the semiconductor fin; removing a portion of the semiconductor fin and obtaining a recess; and introducing a semiconductor etching gas and a semiconductor deposition gas to perform simultaneous deposition and etching of a regrowth region in the recess; wherein a gas flow ratio of the semiconductor etching gas to the semiconductor deposition gas is less than about 0.1.

In some embodiments of the present disclosure, a profile of the regrowth region taken along a plane perpendicular to a direction of the semiconductor fin and the top surface of the insulation region includes a girdle, an upper girdle facet facing away from the insulation region, and a lower girdle facet facing toward the insulation region, and an angle between the upper girdle facet and the girdle is greater than about 54.7 degrees.

In some embodiments of the present disclosure, the regrowth region is an n-type epitaxy.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an insulation region comprising a top surface;
   a semiconductor fin protruding from the top surface of the insulation region;
   a gate over the semiconductor fin; and
   a regrowth region partially positioned in the semiconductor fin, and the regrowth region forming a source/drain region of the semiconductor structure;
   wherein a profile of the regrowth region taken along a plane perpendicular to a direction of the semiconductor fin and top surfaces of the insulation region comprises a girdle possessing a width, a plurality of upper girdle facets facing away from the insulation region, and a plurality of lower girdle facets facing toward the insulation region, and an area of the profile of the regrowth region is greater than an area of a reference profile comprising the girdle, a reference upper girdle facet possessing an angle of about 54.7 degrees, and a reference lower girdle facet possessing an angle of about 54.7 degrees.

2. The semiconductor structure of claim 1, wherein at least one of the plurality of upper girdle facets possesses an angle greater than about 54.7 degrees.

3. The semiconductor structure of claim 1, wherein at least one of the plurality of lower girdle facets possesses an angle greater than about 54.7 degrees.

4. The semiconductor structure of claim 1, wherein at least one of the plurality of upper girdle facets possesses an {mn1} plane, and m and n are integers greater than 1.

5. The semiconductor structure of claim 1, wherein at least one of the plurality of lower girdle facets possesses a {pq1} plane, and p and q are integers greater than 1.

6. The semiconductor structure of claim 1, wherein the regrowth region comprises an epitaxy material.

7. The semiconductor structure of claim 1, wherein the regrowth region comprises n-type dopants.

8. The semiconductor structure of claim 1, wherein the regrowth region comprises p-type dopants.

9. The semiconductor structure of claim 1, wherein the plurality of upper girdle facets possesses an angle less than about 90 degrees.

10. The semiconductor structure of claim 1, wherein the plurality of lower girdle facets possesses an angle less than about 90 degrees.

11. The semiconductor structure of claim 2, wherein the plurality of upper girdle facets includes a first upper girdle facet abutting the girdle, and the first upper girdle facet possesses an angle greater than about 54.7 degrees.

12. The semiconductor structure of claim 3, wherein the plurality of lower girdle facets includes a first lower girdle facet abutting the girdle, and the first lower girdle facet possesses an angle greater than about 54.7 degrees.

13. A semiconductor structure, comprising:
    an insulation region comprising a top surface;
    a semiconductor fin protruding from the top surface of the insulation region;
    a gate over the semiconductor fin; and
    a regrowth region partially positioned in the semiconductor fin, and the regrowth region forming a source/drain region of the semiconductor structure;
    wherein a profile of the regrowth region taken along a plane perpendicular to a direction of the semiconductor fin and top surfaces of the insulation region comprises a girdle possessing a width, a plurality of upper girdle facets facing away from the insulation region, and a plurality of lower girdle facets facing toward the insulation region, and an area composed of the girdle and the plurality of upper girdle facets is greater than an area of a reference upper profile comprising the girdle and a reference upper girdle facet possessing an angle of about 54.7 degrees.

14. The semiconductor structure of claim 13, wherein at least one of the plurality of upper girdle facets possesses an angle greater than about 54.7 degrees.

15. The semiconductor structure of claim 14, wherein the plurality of upper girdle facets includes a first upper girdle facet abutting the girdle, and the first upper girdle facet possesses an angle greater than about 54.7 degrees.

16. The semiconductor structure of claim 13, wherein at least one of the plurality of upper girdle facets possesses an {mn1} plane, and m and n are integers greater than 1.

17. A semiconductor structure, comprising:
    an insulation region comprising a top surface;
    a semiconductor fin protruding from the top surface of the insulation region;
    a gate over the semiconductor fin; and
    a regrowth region partially positioned in the semiconductor fin, and the regrowth region forming a source/drain region of the semiconductor structure;
    wherein a profile of the regrowth region taken along a plane perpendicular to a direction of the semiconductor fin and top surfaces of the insulation region comprises a girdle possessing a width, a plurality of upper girdle facets facing away from the insulation region, and a plurality of lower girdle facets facing toward the insulation region, and an area composed of the girdle and the plurality of lower girdle facets is greater than an area of a reference lower profile comprising the girdle and a reference lower girdle facet possessing an angle of about 54.7 degrees.

18. The semiconductor structure of claim 17, wherein at least one of the plurality of lower girdle facets possesses an angle greater than about 54.7 degrees.

19. The semiconductor structure of claim 18, wherein the plurality of lower girdle facets includes a first lower girdle facet abutting the girdle, and the first lower girdle facet possesses an angle greater than about 54.7 degrees.

20. The semiconductor structure of claim 17, wherein at least one of the plurality of lower girdle facets possesses an {pq1} plane, and m and n are integers greater than 1.

* * * * *